United States Patent [19]
Linder et al.

[11] Patent Number: 5,990,815
[45] Date of Patent: Nov. 23, 1999

[54] MONOLITHIC CIRCUIT AND METHOD FOR ADDING A RANDOMIZED DITHER SIGNAL TO THE FINE QUANTIZER ELEMENT OF A SUBRANGING ANALOG-TO DIGITAL CONVERTER (ADC)

[75] Inventors: Lloyd F. Linder, Agoura Hills; Erick M. Hirata, Torrance; Benjamin Felder, Saugus; William W. Cheng, Redondo Beach; Robert Tso, S. San Gabriel, all of Calif.

[73] Assignee: Raytheon Company, Lexington, Mass.

[21] Appl. No.: 08/941,457

[22] Filed: Sep. 30, 1997

[51] Int. Cl.[6] .................................................. H03M 1/20
[52] U.S. Cl. ............................................................ 341/131
[58] Field of Search ...................................... 341/131, 156

[56] References Cited

U.S. PATENT DOCUMENTS

| | | | |
|---|---|---|---|
| 4,550,309 | 10/1985 | Hiller et al. | 341/131 |
| 4,896,155 | 1/1990 | Craiglow | 341/156 |
| 5,134,399 | 7/1992 | Hiller | 341/131 |

OTHER PUBLICATIONS

Analog/Digital Conversion, Analog–to–Digital Converters, pp. 621–622.
What is Dithering?, Hewlett Packard Journal, Dec. 1993, pp. 44–45.

*Primary Examiner*—Howard L. Williams
*Attorney, Agent, or Firm*—Leonard A. Alkov; William C. Schubert; Glenn H. Lenzen, Jr.

[57] ABSTRACT

A dither circuit is monolithically integrated with a subranging ADC to add a dither signal at the input of the ADC's fine quantizer element to randomize its nonlinear quantization level errors. Because the subranging ADC has at least one overlap bit, the amplitude of the dither signal can range up to at least $2^{M-1}$ LSBs of the fine quantizer without saturating it. The digital equivalent of the dither signal is subtracted at the output of the fine quantizer to maintain the ADC's overall SNR. The randomization of only the fine quantizer element avoids gaining up the nonlinear errors associated with the dither signal itself thereby improving the overall SNR. This approach optimizes performance for small input signals while sacrificing flexibility to correct other sources of error.

19 Claims, 3 Drawing Sheets

MONOLITHIC CIRCUIT AND METHOD FOR ADDING A RANDOMIZED DITHER SIGNAL TO THE FINE QUANTIZER ELEMENT OF A SUBRANGING ANALOG-TO DIGITAL CONVERTER (ADC)

BACKGROUND OF THE INVENTION

1. Field of the Invention

This invention relates to a method of reducing nonlinearity errors in a subranging ADC and more specifically to a method for adding a dither signal to only the ADC's fine quantizer to optimize its small signal performance.

2. Description of the Related Art

Analog-to-digital converters (ADCs) are employed to convert "real world" signals into digital signals that are susceptible to manipulation by digital computers. In this context the term "computer" does not refer exclusively to general purpose computers, but includes special processors such as digital signal processors, vector processors, waveform encoders, etc. The most popular circuit designs for ADCs include successive-approximate, integration (single-, dual, and quad-slope, v-to-f, and $\Sigma$-$\Delta$), counter or "servo", flash and subranging types. Each approach has characteristics that make it most useful for a specific class of applications based on its linearity, absolute and relative accuracy, no-missing codes, resolution, conversion speed, stability, and price.

An ADC's linearity is measured by the deviation of its transfer function from the ideal stair-case transfer function. Ideally, the width of each output code, i.e. the quantum of analog input signal for a given digital output code, is exactly 1 least-significant bit (LSB) and the centers of each output code lie along a straight line. An ADC's differential nonlinearity (DNL) is defined as the deviation in code width from the value of 1 LSB. If DNL errors are large, the output code widths may represent excessively large and small ranges of the input signal so that one or more codes may vanish entirely. Integral nonlinearity error is the deviation of the ADC's transfer function from the straight line and represents the accumulated DNL errors. The sources of DNL and INL errors are many, but are primarily attributable to resistor and transistor gain mismatch in comparators and DACs inside the ADC.

ADCs are used in audio and video recording and transmission, in RADAR and SONAR detection and analysis, and in process monitoring and control systems, to name just a few of the myriad ADC applications. The ADC's nonlinearity errors tend to repeat in response to an analog input signal, and thus produce spurs in its frequency response that distort the signal. Because the spurs tend to lie very close to the signal frequency, it is difficult and expensive to remove them using conventional filtering techniques. The most widely used approach to improve linearity is to laser trim the ADC's bias resistors to correct mismatch, and thus reduce the DNL and INL errors directly.

Another approach, as described by Manfred Bartz, Hewlett-Packard Journal, December 1993, pp. 44–45, is to add a dither signal to the analog input signal and subtract its digital equivalent from the output of the ADC. This randomizes the ADC's nonlinear quantization errors and thus distributes them throughout its frequency response, reducing or eliminating the spurs, without degrading the overall SNR. The degree of improvement is directly related to the magnitude of the dither signal; the larger the dither signal the greater the randomization of the quantization errors. However, if the analog input signal varies over the full-scale input range of the ADC, a dither signal greater than 1 LSB may saturate the ADC thereby lowering the overall SNR. As a practical matter, the analog input signal must be constrained to be no greater than mid-scale to realize any significant benefit from dithering. This effectively wastes one bit of resolution. Furthermore, the dither circuitry is external to the ADC, and thus will not track processing variations or temperature changes.

Flash and subranging ADCs are discussed by Paul Horowitz, Winfield Hill, *The Art of Electronics*, Cambridge University Press, New York, 1989, pages 621 and 622. The highest conversion rates are attainable using a single N-bit flash quantizer that has $2^N-1$ comparators biased 1 LSB apart using a resistive ladder. As the input increases, it causes an increasing number of comparators to switch states. The outputs of the comparators are applied to a logic encoder, which can implement any one of several encoding schemes, including offset binary, 2's complement, sign magnitude, Gray code and binary-coded-decimal (BCD). The great advantage of a flash converter is that the only delays encountered in the conversion process are those attributable to the ladder/comparator stage and to the encoder. However, a high resolution flash ADC is not cost or space efficient due to the enormous number of resistors and comparators.

For these reasons, the flash ADC architecture is employed as a component in a subranging ADC, which capitalizes on the flash ADC's speed but also substantially reduces the number of components. A subranging ADC captures an analog signal using a sample and hold circuit that couples the "held" signal to a course (L-bit) flash-quantizer and a summing amplifier. The course quantizer provides a digital signal to a DAC which "reconstructs" the original analog input signal. The summing amplifier subtracts the reconstructed signal from the held input signal, gains up the residual and feeds it to a fine M-bit flash-quantizer, which converts the residual signal to provide the least significant bits of the subranging ADC. An extra bit(s) is provided in the fine-quantizer to provide an "overlap" that compensates for the quantization level error in the coarse quantizer. To achieve the same resolution as a single N-bit flash quantizer with one overlap bit, the coarse and fine quantizer bit rates satisfy L+M−1=N.

The subranging ADC may exhibit significant nonlinearity errors, which are attributable to its parallel architecture that requires a relatively large number of matched resistors and comparators as compared to other ADC types. Typically, the resistor values are laser trimmed as described above. If Hewlett-Packard's external dithering circuitry were connected around a subranging ADC, the dither signal would randomize the quantization errors in both the coarse and fine quantizers as well as the nonlinear errors in the other circuit components. However, in order to add enough noise to realize these benefits the input signal would have to be constrained to be less than mid-scale of the coarse quantizer. Furthermore, the discrete dithering circuit and ADC would not track processing and temperature variations. Most importantly, the nonlinear errors in the external DAC are gained up by the summing amplifier. This additional noise is significant, and will severely degrade the overall noise figure and SNR of the subranging ADC, especially for small input signals.

SUMMARY OF THE INVENTION

In view of the above problems, the present invention provides a monolithic circuit and method for reducing DNL and INL errors in a subranging ADC, particularly for small amplitude input signals, which tracks both processing and temperature variations.

This is accomplished with a dither circuit that is preferably monolithically integrated as part of the subranging ADC. The dither circuit produces a random dither signal that is added to only the residual signal at the input of the ADC's M-bit fine quantizer element to randomize its nonlinear quantization level errors. Because the subranging ADC has at least one overlap bit, the amplitude of the dither signal can range up to at least $2^{M-1}$ LSBs of the fine quantizer without saturating it. The digital equivalent of the dither signal is subtracted at the output of the fine quantizer to maintain the ADC's overall SNR.

The addition of a dither signal to only the fine quantizer element has several advantages. Primarily, the non-linear errors in the dither signal itself are not gained up by the summing amplifier, which improves the ADC's overall SNR. Second, because the fine quantizer element's nonlinear errors dominate the subranging ADC for very small input signals, particularly those below the coarse quantizer's quantization level, the current approach minimizes the overall ADC errors. Furthermore, since noise is not added at the input of the coarse quantizer, the input signal can range up to its full-scale value. However, at larger signal amplitudes the coarse quantizer and DAC's nonlinear errors will tend to dominate, and thus the current approach will be inferior to the known dithering techniques.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a monolithically integrated subranging ADC, which includes a dither circuit that applies a dither signal to only the ADC's M-bit fine quantizer element. Because of the minimum one bit overlap associated with subranging ADC's, the dither signal has a range of at least $2^{M-1}$ LSBs of the fine quantizer, which improves the randomization of the fine quantizer. By focusing on the fine quantizer errors, this approach sacrifices some flexibility, but optimizes the ADC's performance for small amplitude input signals.

Figure 1:
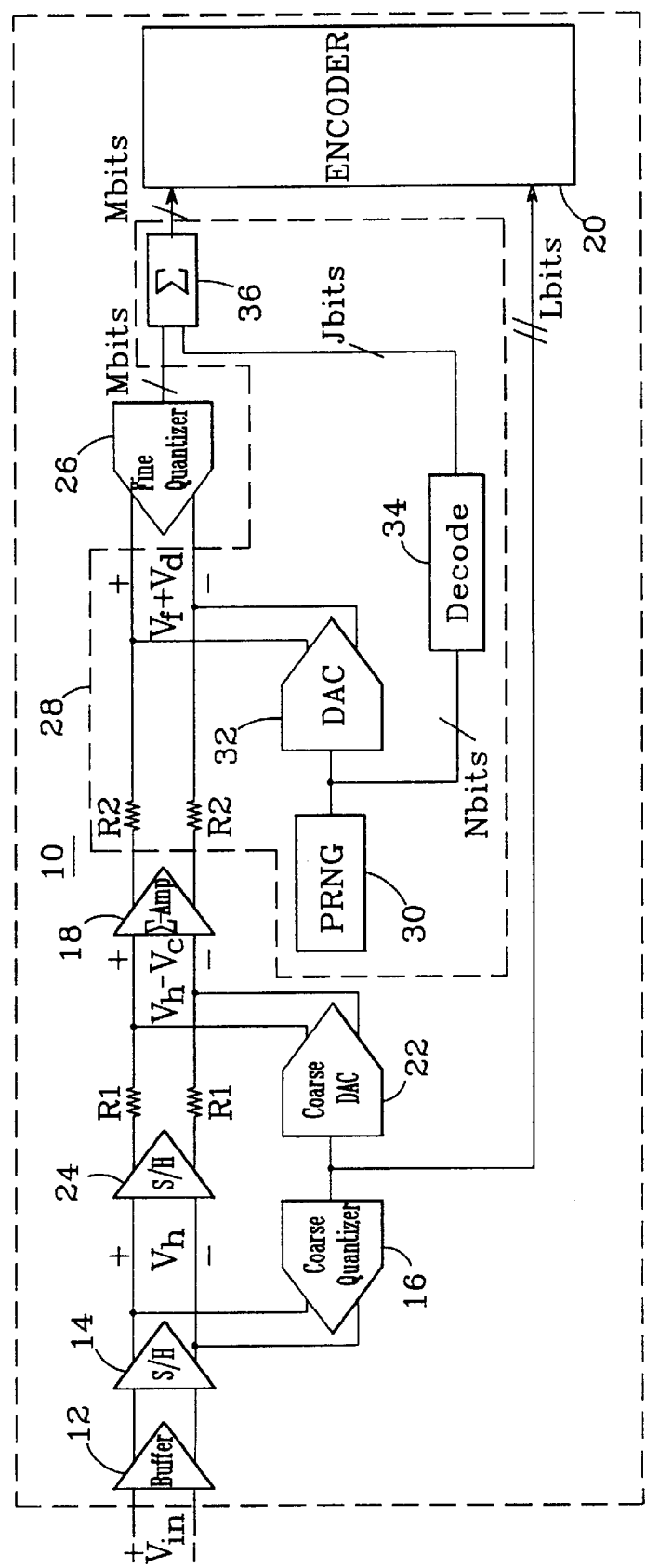
FIG. 1 is a block diagram of a subranging ADC that adds a randomized dither signal to its fine quantizer element in accordance with the present invention.

FIG. 1 is a block diagram of a preferred embodiment of a monolithically integrated subranging ADC IC 10. The ADC does not have to be monolithically integrated, but the ability to track processing and temperature variations and to directly reduce the components' DNL and INL errors makes it highly desirable. The subranging ADC captures an analog signal $V_{in}$ using an input buffer 12 that isolates the ADC and a sample and hold (S/H) circuit 14 that is clocked to couple the "held" signal $V_h$ to a course L-bit flash-quantizer 16 and a summing amplifier 18. Course quantizer 16 outputs an L-bit digital signal that is directed to an encoder circuit 20 to provide the ADC's most significant bits and to a coarse DAC 22, which "reconstructs" the original analog input signal by drawing current through resistors R1. On average, the error in the reconstructed signal $V_C$ exceeds 1 LSB because the coarse DAC's quantization levels exhibit some degree of error. A sample-and-hold (S/H) circuit 24 delays the held signal $V_h$ so that it is synchronized to the reconstructed signal $V_C$.

Summing amplifier 18 subtracts the reconstructed signal $V_C$ from the held input signal $V_h$, gains up the residual signal $V_F$ and feeds it to a fine M-bit flash-quantizer 26, which converts the residual signal $V_F$ to a fine digital signal that provides the least significant bits of the subranging ADC. An extra bit(s) is provided in fine-quantizer 26 to define the "overlap" that compensates for the quantization level error in coarse quantizer 16. The amount of overlap is set by the gain of summing amplifier 18. For example, 1 LSB of overlap, referenced to the full-scale of the coarse quantizer, corresponds to mapping a full-scale input signal to one-half the full-scale input range of the fine quantizer.

A dither circuit 28 adds an analog dither signal $V_d$ to the residual signal $V_F$ thereby randomizing the nonlinear quantization level errors in the fine quantizer that would otherwise produce spurs in the ADC's frequency response. The digital equivalent of the dither signal is subtracted from the fine digital signal to maintain the ADC's overall signal-to-noise ratio. Because the subranging ADC has at least 1 LSB of overlap as defined above, the dither circuit can add at least $2^{M-1}$ LSBs, referenced to the full-scale input range of the fine quantizer, to the residual signal without saturating the fine quantizer. The dither signal can have a uniform, Gaussian, Laplacian or any other random probability density function. This approach minimizes the errors due to the fine quantizer element, which reduces the overall ADC errors for all input signal amplitudes, and, in particular, optimizes the ADC's error for small amplitude signals, e.g. those less than the coarse quantizer's quantization level.

In the embodiment shown, dither circuit 28 produces an analog dither signal having a Gaussian distribution. A pseudo-random number generator (PRNG) 30 generates K-bit random codes. An all zero code is not a valid output in known PRNGs. To get an approximately uniform distribution of codes, an N-bit portion of each code is extracted where K>>N. As a result, the individual N-bit codes have an approximately uniform distribution.

An N-bit unary DAC 32 is used to convert the N-bit codes into the analog dither signal $V_d$. The DAC's total output current is drawn through resistors R2 to offset the residual signal by the analog dither signal. Unary DACs are preferred because they exhibit substantially less glitch than binary DACs. Therefore, it only matters how many of the unary DAC's current cells are turned on or off, not which ones. The distribution of how many are turned on/off is approximately Gaussian (the sum of uniform random variables exhibits a Gaussian distribution) with a value of N/2 being the most likely. The DAC's output current is offset by N/2 current units so that the analog dither signal varies between ±N/2 LSBs with a Gaussian distribution centered at zero.

A decoder 34 converts the N-bit unary codes into a J-bit binary code that is the binary equivalent of the analog dither signal. A digital summing circuit 36 subtracts the J-bit binary code from the fine quantizer's M-bit output signal to remove the overall noise added by the dither signal. The addition and subsequent subtraction of the dither signal maintains the ADC's SNR while randomizing the quantization errors in the fine quantizer.

The subranging ADC's encoder 20 merges the L most significant bits (MSBs) with the M LSBs. For 1-bit of overlap, the encoder looks at the MSB of the M LSBs. If it is 1, all of the L-bits are passed with the M-1 LSBs appended thereto. If it is 0, the encoder subtracts 1 LSB from the L-bits and appends the M-1 LSBs thereto. The operation of the encoder is well known in the art of subranging ADCs.

Figure 2:
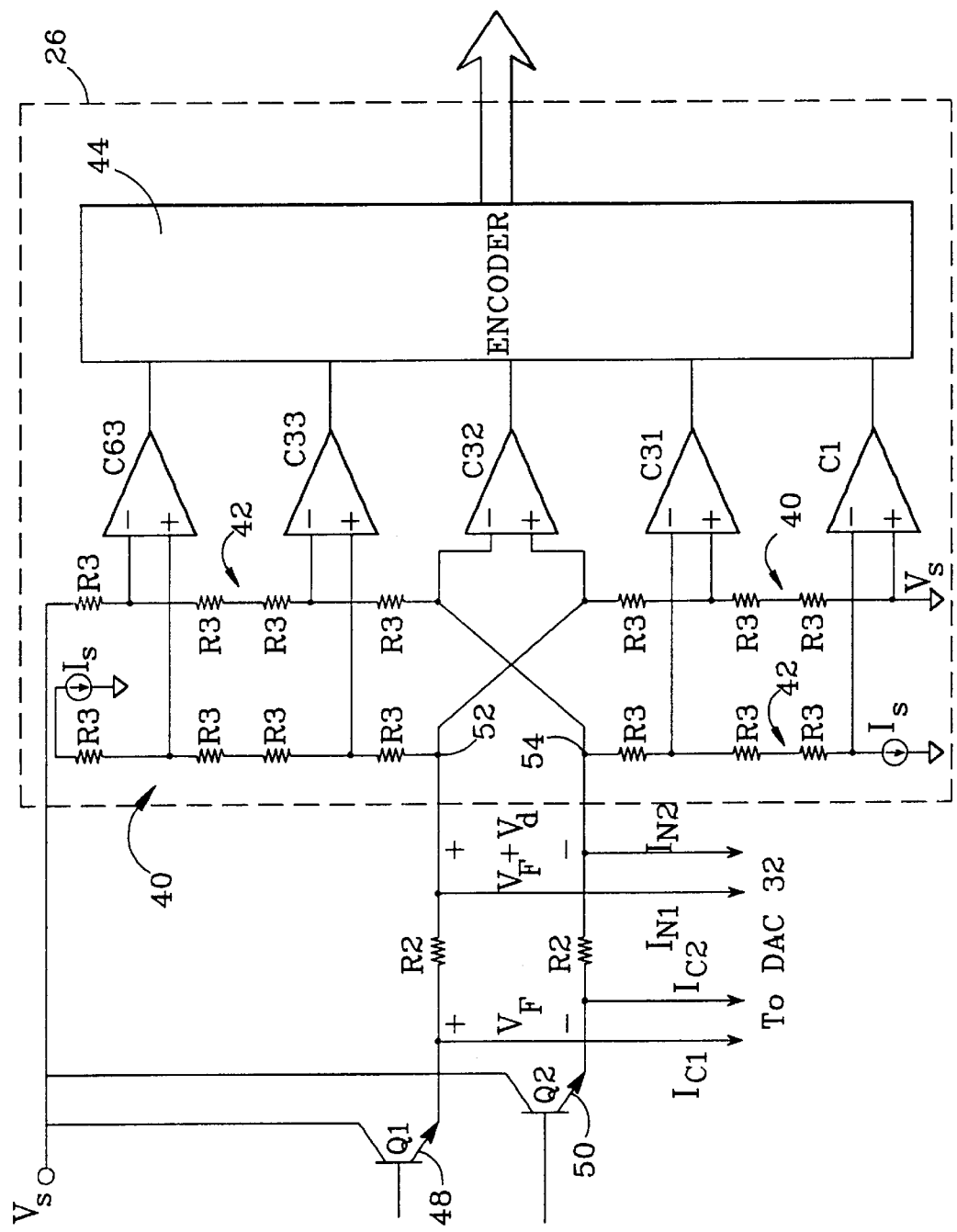
FIG. 2 is a schematic diagram of the monolithically integrated M-bit flash quantizer shown in FIG. 1.
Figure 3:
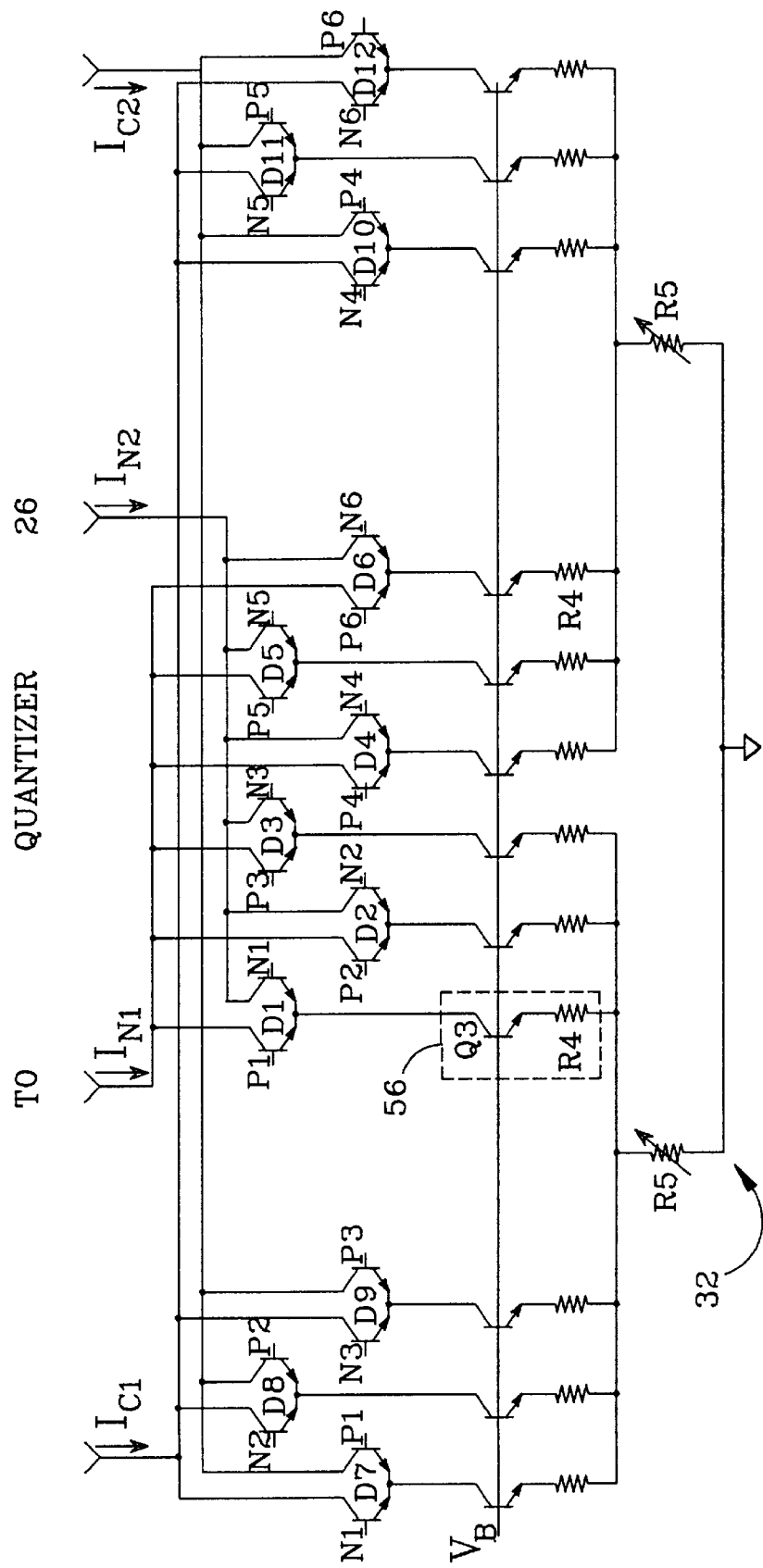
FIG. 3 is a schematic diagram of the monolithically integrated N-bit DAC shown in FIG. 1.

FIGS. 2 and 3 together illustrate a preferred embodiment of a portion of the monolithically integrated subranging ADC IC 10 including the summing amplifier's output transistors Q1 and Q2, bias resistors R2, 6-bit unary DAC 32 and 7-bit fine quantizer 26, which exhibits 1 LSB of overlap with the coarse quantizer. Fine quantizer 36 is suitably a differential flash quantizer that includes positive and negative resistor ladders 40 and 42, $2^6-1$ comparators C1, C2, . . . C63 differentially tapped off both ladders and biased 1 LSB (of the fine quantizer) apart, and an encoder circuit 44, which can implement any one of several encoding schemes, including offset binary, 2's complement, sign magnitude, Gray code and binary-coded-decimal(BCD). Each ladder includes 64 equal valued resistors R3 connected in series between a supply voltage $V_s$ and a current source $I_s$. Alternately, a folded interpolated flash quantizer, which requires fewer resistors and comparators but additional encoding circuitry, can be used.

Ignoring the application of the random dither signal, the residual signal $V_F$, which is the differential voltage between the emitters 48 and 50 of transistors Q1 and Q2, respectively, is applied, via resistors R2, across taps 52 and 54 at the middle of the positive and negative ladders, respectively, and controls the differential voltage applied to the comparators. At balance ($V_F=0$), comparators C1–C31 are turned on, comparators C33–C63 are turned off, and C32 is exactly balanced. As the magnitude of the residual signal increases in a positive direction, comparator C32 and each successive comparator C33–C63 switches state. Similarly, when the magnitude of the residual signal increases in a negative direction, comparator C32 switches off and each successive comparator C31–C1 turns off. The encoder 44 converts the thermometer code output by the bank of comparators into the Gray code, for example.

As shown in FIG. 3, the 6-bit unary DAC 32 adds the dither signal $V_d$ to the residual signal by drawing complementary discrete currents $I_{N1}$ and $I_{N2}$ that randomly vary between 0 and 6 reference currents $I_{ref}$, through the pair of resistors R2 shown in FIG. 2 thereby offsetting the residual signal at taps 52 and 54. The reference current $I_{ref}$ and bias resistor R2 values are preferably set so that the dither signal has a range of six LSBs of the fine quantizer. As a result, the same value of the residual signal will switch different combinations of comparators thereby randomizing their nonlinear errors.

Unary DAC 32 includes six identical current sources 56 that source reference current $I_{ref}$ to respective differential pairs D1 through D6 that are controlled by the random digital signal (P1,P2, . . . ,P6) and its complement (N1,N2, . . . ,N6) produced by the PRNG 30 shown in FIG. 1. Each differential pair routes the reference current $I_{ref}$ to either $I_{N1}$ or $I_{N2}$. When the digital signal is all zeros, current $I_{N1}$ equals zero and $I_{N2}$ equals $6I_{ref}$. Conversely, when the signal is all ones, current $I_{N2}$ equals zero and $I_{N1}$ equals $6I_{ref}$. When the signal is half ones and half zeros, both currents are equal to $3I_{ref}$. As a result, the dither signal swings between plus and minus six LSBs of the fine quantizer with a Gaussian distribution. Because the architecture provides at least 1 LSB (of the coarse quantizer) of overlap, the residual signal plus the dither signal will not saturate the fine quantizer.

To avoid base-emitter modulation of the summing amplifier's output transistors Q1 and Q2 shown in FIG. 2, compensation currents $I_{C1}$ and $I_{C2}$, which are complementary to currents $I_{N1}$ and $I_{N2}$ respectively, are drawn directly from their emitters. As a result, transistors Q1 and Q2 always conduct an emitter current of $6I_{ref}$ regardless of the value of the random signal, and thus do not experience base-emitter modulation. This is accomplished using an additional six differential pairs D7 through D12 that are also controlled by the random digital signal (P1,P2, . . . ,P6) and its complement (N1,N2, . . . ,N6), but with complementary logic to D1 through D6. Current sources 56, which are each suitably a forward biased npn transistor Q3 and an emitter resistor R4, supply reference current to the differential pairs D7–D12.

By monolithically integrating the N-bit DAC 32, fine quantizer 36 and the other components shown in FIG. 1, the DNL and INL errors will be reduced by improving transistor and resistor matching and will track over processing and temperature variations. Any remaining linear gain error can be removed by trimming resistors R5 connected between the current sources and ground.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A subranging analog-to-digital converter (ADC), comprising:
   a sample-and-hold circuit that periodically samples an analog input signal and holds its value;
   a coarse quantizer that quantizes the analog input signal to produce a coarse digital signal;
   a coarse digital-to-analog converter (DAC) that converts the coarse digital signal into an analog offset signal;
   a summing amplifier that subtracts the analog offset signal from the held value of the analog input signal and amplifies the residual signal to produce a residual analog signal;
   a random number generator that generates a random digital signal;
   a randomization DAC that converts the random digital signal to an analog dither signal and adds the dither signal to the residual analog signal;
   a fine quantizer that quantizes the residual analog signal to produce a fine digital signal, the dithering of said residual analog signal randomizing the nonlinear quantization level errors in said fine quantizer that would otherwise produce spurs in the frequency response of the fine digital signal;
   a digital summing circuit that subtracts the random digital signal from the fine digital signal to remove the noise added by the dither signal; and
   an encoder that merges the coarse and fine digital signals.

2. The subranging ADC of claim 1, wherein said coarse and fine quantizers have respective full-scale input ranges, said summing amplifier's gain being set so that a full-scale analog input signal is mapped to at most one-half the full-scale input range of the fine quantizer thereby providing an overlap of at least one least significant bit (LSB) of the coarse DAC to correct for its quantization level errors, the analog dither signal produced by said random number generator and said randomization DAC representing more than 1 LSB of the fine quantizer.

3. The subranging ADC of claim 2, wherein the overlap represents one LSB of the coarse quantizer and said fine quantizer has M bits of resolution, said random number generator and said randomization DAC producing the analog dither signal with up to $2^{M-1}$ LSBs of the fine quantizer without saturating it.

4. The subranging ADC of claim 2, wherein the analog signal is only applied to said fine quantizer so that said analog input signal can range up to the coarse quantizer's full-scale input range without saturating it.

5. The subranging ADC of claim 1, wherein said ADC is monolithically integrated in a single integrated circuit.

6. The subranging ADC of claim 1, wherein said randomization DAC is an N-bit unary DAC, said randomization generator generating a K-bit random digital signal where K is greater than N so that the length N random digital signals applied to the randomization DAC are approximately uniformly distributed in probability and the analog dither signal added to the residual analog signal has an approximately Gaussian distribution.

7. A monolithically integrated subranging analog-to-digital converter (ADC), comprising:
  a sample-and-hold circuit that periodically samples an analog input signal and holds its value;
  a coarse L-bit flash quantizer having a fullscale input range that quantizes the analog input signal to produce a coarse digital signal, said analog input signal ranging up to the quantizer's full-scale input range without saturating it;
  a coarse digital-to-analog converter (DAC) that converts the coarse digital signal into an analog offset signal at one of a plurality of discrete levels;
  a summing amplifier that subtracts the analog offset signal from the held value of the analog input signal and amplifies the residual signal to produce a residual analog signal;
  a fine M-bit flash quantizer having a full-scale input range that quantizes the residual analog signal to produce a fine digital signal, said summing amplifier's gain being set so that a full-scale analog input signal is mapped to at most one-half the full-scale input range of the fine quantizer thereby providing an overlap of at least one least significant bit (LSB) of the coarse DAC to correct for errors in its discrete levels;
  a random number generator that generates a random digital signal;
  a randomization DAC that converts the random digital signal to an analog dither signal that represents more than one LSB of the fine quantizer and adds the dither signal to the residual analog signal at the input of the fine quantizer without saturating it, the dithering of said residual analog signal randomizing the nonlinear quantization level errors in said fine quantizer that would otherwise produce spurs in the frequency response of the fine digital signal;
  a digital summing circuit that subtracts the random digital signal from the fine digital signal to remove the noise added by the dither signal; and
  an encoder that merges the coarse and fine digital signals.

8. The subranging ADC of claim 7, wherein the overlap represents one LSB of the coarse quantizer, said random number generator and said randomization DAC producing the analog dither signal with up to $2^{M-1}$ LSBs of the fine quantizer without saturating it.

9. The subranging ADC of claim 7, wherein the analog dither signal is only applied to said fine quantizer.

10. The subranging ADC of claim 7, wherein said randomization DAC is an N-bit unary DAC, said randomization generator generating a K-bit random digital signal where K is greater than N so that the length N random digital signals applied to the randomization DAC are approximately uniformly distributed in probability and the analog dither signal added to the residual analog signal has an approximately Gaussian distribution.

11. An analog-to-digital converter (ADC), comprising:
  a subranging ADC that captures an analog signal using a sample and hold circuit, couples the "held" signal to a course flash-quantizer that provides the most significant bits of the subranging ADC and a summing amplifier, uses a course DAC to reconstruct a coarse approximation to the analog input signal which the summing amplifier subtracts from the held input signal, gains up the residual and feeds it to a fine M-bit flash-quantizer, which converts the residual signal to provide the least significant bits of the subranging ADC; and
  a dither circuit that adds a random dither signal to the residual signal thereby randomizing the nonlinear quantization level errors in said fine quantizer that would otherwise produce spurs in the frequency response of the subranging ADC and subtracts the digital equivalent of the random dither signal from the least significant bits of the subranging ADC to maintain its overall signal-to-noise ratio.

12. The ADC of claim 11, wherein said subranging ADC and said dither circuit are monolithically integrated on a single integrated circuit.

13. The subranging ADC of claim 12, wherein said coarse and fine DACs have respective full-scale input ranges, said summing amplifier's gain being set so that a full-scale analog input signal is mapped to at most one-half the full-scale input range of the fine quantizer thereby providing an overlap of at least one least significant bit (LSB) of the coarse DAC to correct for its quantization level errors, the random dither signal produced by said dither circuit representing more than 1 LSB of the fine quantizer.

14. The subranging ADC of claim 13, wherein the overlap represents one LSB of the coarse quantizer, said dither circuit producing the random dither signal with up to $2^{M-1}$ LSBs of the fine quantizer without saturating it.

15. The subranging ADC of claim 12, wherein the random dither signal has an approximately Gaussian distribution.

16. In a subranging analog-to-converter (ADC) that captures an analog signal using a sample and hold circuit, couples the "held" signal to a course flash-quantizer that provides the most significant bits of the subranging ADC and a summing amplifier, uses a course DAC to reconstruct a coarse approximation to the analog input signal which the summing amplifier subtracts from the held input signal, gains up the residual and feeds it to a fine M-bit flash-quantizer, which converts the residual signal to provide the least significant bits of the subranging ADC, a method for reducing spurs in the ADC's frequency response, comprising:
  generating a random digital signal,
  converting the random digital signal into an analog dither signal;
  adding the analog dither signal to the residual signal; and
  subtracting the random digital signal from the least significant bits of the subranging DAC.

17. The method of claim 16, wherein said coarse and fine quantizers have respective full-scale input ranges, further comprising:

setting said summing amplifier's gain so that a full-scale analog input signal is mapped to at most one-half the full-scale input range of the fine quantizer thereby providing an overlap of at least one least significant bit (LSB) of the coarse DAC to correct for its quantization level errors, said analog dither signal being generated so that it represents more than 1 LSB of the fine quantizer.

18. The method of claim 17, wherein the overlap represents one LSB of the coarse quantizer, said analog dither signal being generated with up to $2^{M-1}$ LSBs of the fine quantizer without saturating it.

19. The method of claim 16, wherein the analog dither signal is only applied to said fine quantizer so that said analog input signal can range up to the coarse quantizer's full-scale input range without saturating it.

* * * * *